United States Patent [19]

Kondo

[11] Patent Number: 5,252,883
[45] Date of Patent: Oct. 12, 1993

[54] LAMINATED TYPE PIEZOELECTRIC ACTUATOR

[75] Inventor: Masahiro Kondo, Tokyo, Japan

[73] Assignee: NEC Corporation, Tokyo, Japan

[21] Appl. No.: 828,221

[22] Filed: Jan. 30, 1992

[30] Foreign Application Priority Data

Jan. 30, 1991 [JP] Japan .................... 3-10242

[51] Int. Cl.$^5$ .............................. H01L 41/08
[52] U.S. Cl. .................... 310/328; 310/366; 310/368
[58] Field of Search ............. 310/328, 366–368, 310/312

[56] References Cited

U.S. PATENT DOCUMENTS 2,479,926  8/1949  Gravley ................ 310/328

FOREIGN PATENT DOCUMENTS

| 61-206281 | 9/1986 | Japan | 310/368 |
| 0199076 | 9/1987 | Japan | 310/366 |
| 0055986 | 3/1988 | Japan | 310/366 |
| 0056971 | 3/1988 | Japan | 310/366 |

*Primary Examiner*—Mark O. Budd
*Attorney, Agent, or Firm*—Sughrue, Mion, Zinn, Macpeak & Seas

[57] ABSTRACT

A laminated type piezoelectric actuator having a laminated body formed by alternately laminating piezoelectric ceramic layers and internal electrode layers, each of which are approximately the same shape. The four corners or edges of each layer of the ceramic layers and the internal electrode layers, which edges extend in parallel with the lamination direction of the laminated body, are machined to form a convex, arcuate shape or an angled, planar shape. This enables the end parts of each layer, which have a high distribution density of microcracks, to be removed, so that interlayer short-circuiting between the internal electrode films caused by the microcracks is prevented. Accordingly, the operation life and the reliability of the actuator of this invention is extended and improved, respectively, even when it is driven by a driving voltage which is exactly or close to that of a dc voltage in a highly humid environment. By using a Pb $(Ni_\frac{1}{3}Nb_\frac{1}{3}) O_3$—$PbTiO_3$—$PbZrO_3$ system perovskite structure compound oxide as the piezoelectric ceramic piece, and removing each of the four edges in the cross section to exhibit a convex, arcuate shape with a radius of curvature equal to or greater than 1.0 mm, or an angled, planar shape having a chamfering length equal to or greater than 0.8 mm, it is possible to increase the life of the actuator to about 10 times that of the actuator of the prior art.

4 Claims, 5 Drawing Sheets

LAMINATED TYPE PIEZOELECTRIC ACTUATOR

BACKGROUND OF THE INVENTION

The present invention relates to a laminated type piezoelectric actuator having a structure of an integral laminated body obtained by alternately laminating a thin platelike piezoelectric ceramic piece and a thin filmlike internal electrode, and more particularly, to a laminated type piezoelectric actuator having a structure in which an internal electrode thin film is alternately laminated over substantially the entire surface of a piezoelectric ceramic piece.

The laminated type piezoelectric actuator of this type makes it possible to enhance the strength of the electric field that is applied to each layer of the piezoelectric ceramic pieces, and moreover, the displacement due to elongation or concentration of the ceramic accompanying the piezoelectric effect for each layer is accumulated, so that a large displacement can be generated for a low voltage, and the actuator is therefore well suited for miniaturization. In particular, the laminated type piezoelectric actuators, which are disclosed in the U.S. Pat. Nos. 4,523,121 and 4,681,667 granted to the same assignee as in the present invention, have approximately the same shape for the piezoelectric ceramic piece and the internal electrode film that are laminated therebetween, and have a structure in which a uniform electric field is applied to the entirety of the piezoelectric ceramic piece. Accordingly, each of the piezoelectric pieces in an actuator with the above-mentioned structure expands or contracts throughout the actuator without generating inactivated parts, so that there are no problems with respect to an uneven expansion or contraction of the piezoelectric ceramic piece due to the inactivated part. Further, the piezoelectric ceramic piece is not damaged by the generation of a stress at the boundary of the activated part and the inactivated part. Therefore, the laminated type piezoelectric actuators disclosed in the aforementioned two U.S. patents are used for a printing head for an impact printer, a small-sized relay, or the like for which small-size and high-speed repeated driving are required.

The reliability of this type of actuator for the above-mentioned usage is high, and the usage tends therefore to be further expanded. It has been observed, however, that the deterioration of the device will appear sooner depending upon the conditions of use. For example, when the driving voltage is exactly or approximately the voltage of a direct current such as in an actuator for closing or opening a mass flow controller valve used for the manufacture of semiconductor integrated circuits, the service life sometimes remains only at about 1000 hours. When the installation place of the actuator is in an environment of high humidity, the life will further be shortened. For example, the result of a humidity resistance on-load life test, in which a maximum rated dc voltage of 150 V (an electric field strength in the piezoelectric ceramic piece being about 15,000 V/cm) is applied continuously, in an atmosphere having a temperature of 40° C. and a relative humidity of 90 to 95%, to a conventional laminated type piezoelectric actuator with a length of 20 mm and a cross sectional area perpendicular to the direction of lamination of 5 mm×5 mm, formed into a laminated body by alternately laminating a piezoelectric ceramic piece consisting of lead titanate-zirconate and an internal electrode consisting of a silver-palladium alloy, the mean time to failure (MTTF) was about 500 hours. This value barely satisfies the need of the user who drives the laminated type piezoelectric actuator, but it is not a value with sufficient margin. Ordinarily, a life which is more than ten times the catalog value is desirable.

As a result of observation and analysis of samples that developed failures in the above-mentioned humidity resistance on-load life test, the present applicant found that these failures are caused by the short-circuiting generated between the internal electrodes via microcracks in the outer periphery of the ceramic pieces that are exposed to the atmosphere on the side faces of the laminate. Further, it was observed that the short-circuiting between the internal electrodes was especially concentrated in the vicinity of the four corners or edges of the laminate that run in parallel with the lamination direction of the laminate.

SUMMARY OF THE INVENTION

It is therefore an object of the invention to provide a highly reliable laminated type piezoelectric actuator whose life will not be affected even when it is driven by a d.c. or a near d.c. driving voltage in a highly humid environment.

The laminated type piezoelectric actuator according to the present invention is an actuator having an integrated structure obtained by alternately laminating a plurality of piezoelectric ceramic layers and internal electrode layers with substantially the same shape, and is characterized in that the four end parts of each layer of the ceramic and the internal electrode that form the respective four edges along the direction of laminating the ceramic layers and the internal electrode layers, are removed by grinding the four end parts into an angled, linear shape or a convex, arcuate shape. The removal of the four end parts preferably done by grinding the four edges in the finishing stage after the assembly of the laminate. Since the four end parts of each layer, having a high distribution density of the microcracks, are removed by the machining of the end parts of each layer that form the four edges, the aforementioned interlayer short-circuiting of the internal electrode layers will not take place in this invention.

The aforementioned interlayer short-circuiting between the internal electrodes is considered to be caused by the concentrated generation of mechanical stress in each of the four end parts of the ceramic layer during the stage of segmenting the ceramic layers from a piezoelectric ceramic sintered body, the generation of the microcracks by the stress, further enlargement of the microcracks due to the operating environment of the laminate, and the infiltration of water vapor within the atmosphere into the microcracks. The water vapor which remains in the form of water droplets after infiltration into the microcracks tends to be evaporated due to temperature rise accompanying the hysteresis loss when the laminate is pulse driven. No hysteresis loss and associated temperature rise occur when the laminate is driven by a dc voltage, and the droplets therefore remain within the microcracks over a long period of time. This is considered to be the cause of deterioration of the laminate which is driven by a direct current.

BRIEF DESCRIPTION OF THE DRAWINGS

The above-mentioned and other objects, features, and advantages of this invention will become more apparent by reference to the following detailed description of the invention taken in conjunction with the accompanying drawings wherein.

DESCRIPTION OF THE PREFERRED EMBODIMENTS

Figure 1:
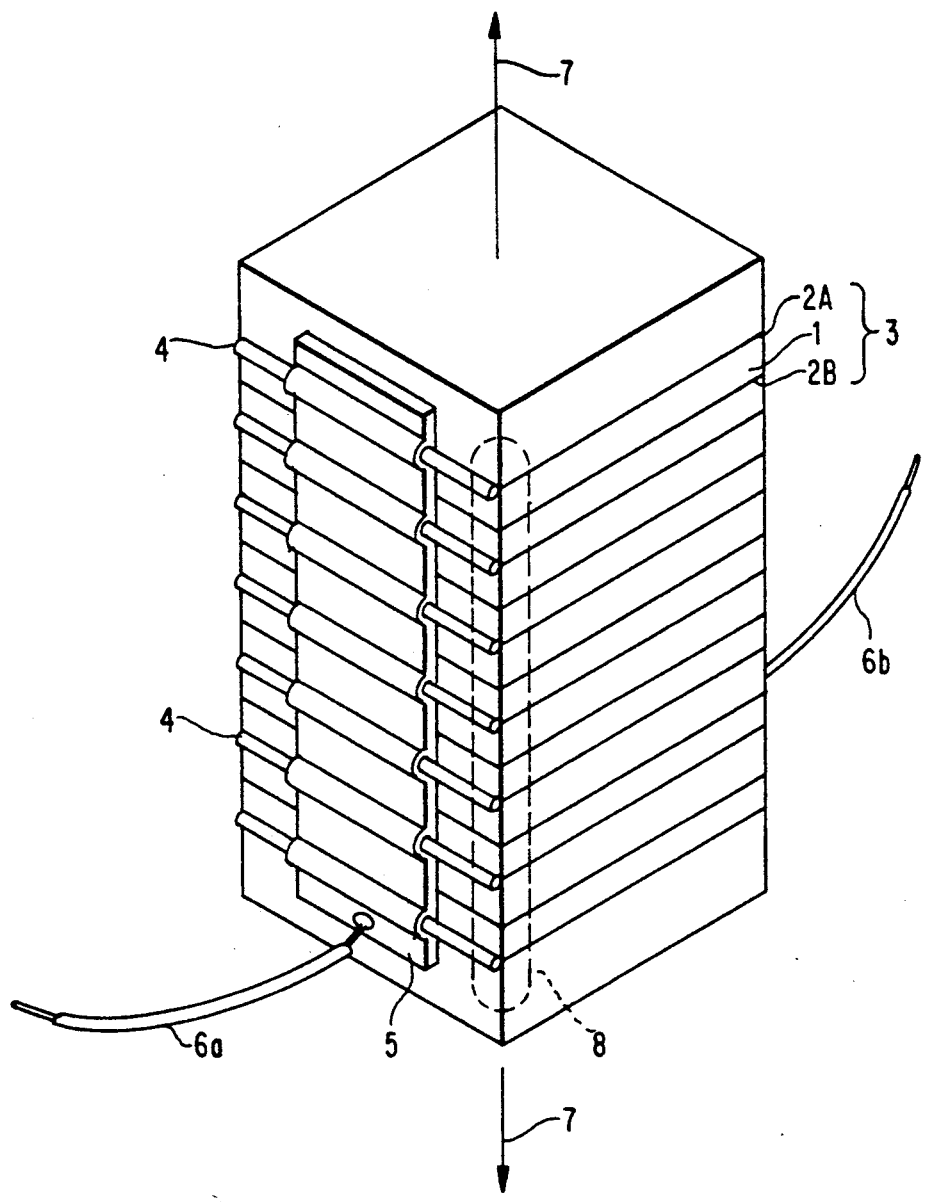
FIG. 1 is a perspective view of a prior art laminated type piezoelectric actuator.

Referring to FIG. 1, a prior art laminated type piezoelectric actuator shown in the figure forms a laminated body 3 by alternately overlaying a thin platelike piezoelectric ceramic piece 1 and thin film-like internal electrode films 2A and 2B. The edges of the internal electrode film 2A or 2B are exposed on the four side faces that are parallel to the lamination direction of the laminated body 3. The edges of the odd numbered layers of the electrode films 2A and the even numbered layers of the electrode films 2B are covered individually with a slender glass film 4 on one and on the other, respectively, of a pair of opposite side faces. These glass films 4 form insulating layers between the external electrode 5 that covers the glass films and the electrode films 2A or 2B. The electrode films 2B of even numbered layers that are in direct contact with the external electrode 5 without an intermediary glass film on the one of the pair of side faces, and analogously, the electrode films 2A of odd numbered layers that are in direct contact with the external electrode on the other of the pair of side faces are connected to a driving power supply (not shown) via the conductors 6b and 6a, respectively. With the above-mentioned construction, an electric field is applied to each of the piezoelectric ceramic pieces 1 through a pair of internal electrode films 2A and 2B that face one another with each of the piezoelectric ceramic pieces in between, so that mechanical displacements are generated in the directions shown by the arrows 7.

The laminated type piezoelectric actuator is segmented as a laminated body of predetermined dimensions through two cutting processes from a large sintered body as disclosed in the U.S. Pat. No. 4,681,667. The four edges that run parallel to the lamination direction of the laminated body have just gone through the segmenting process, and the angles, in the cross-sectional plane, of the edges portions shown by broken lines (only one portion out of the four is shown in the figure by a broken line 8), are substantially 90°.

Figure 2:
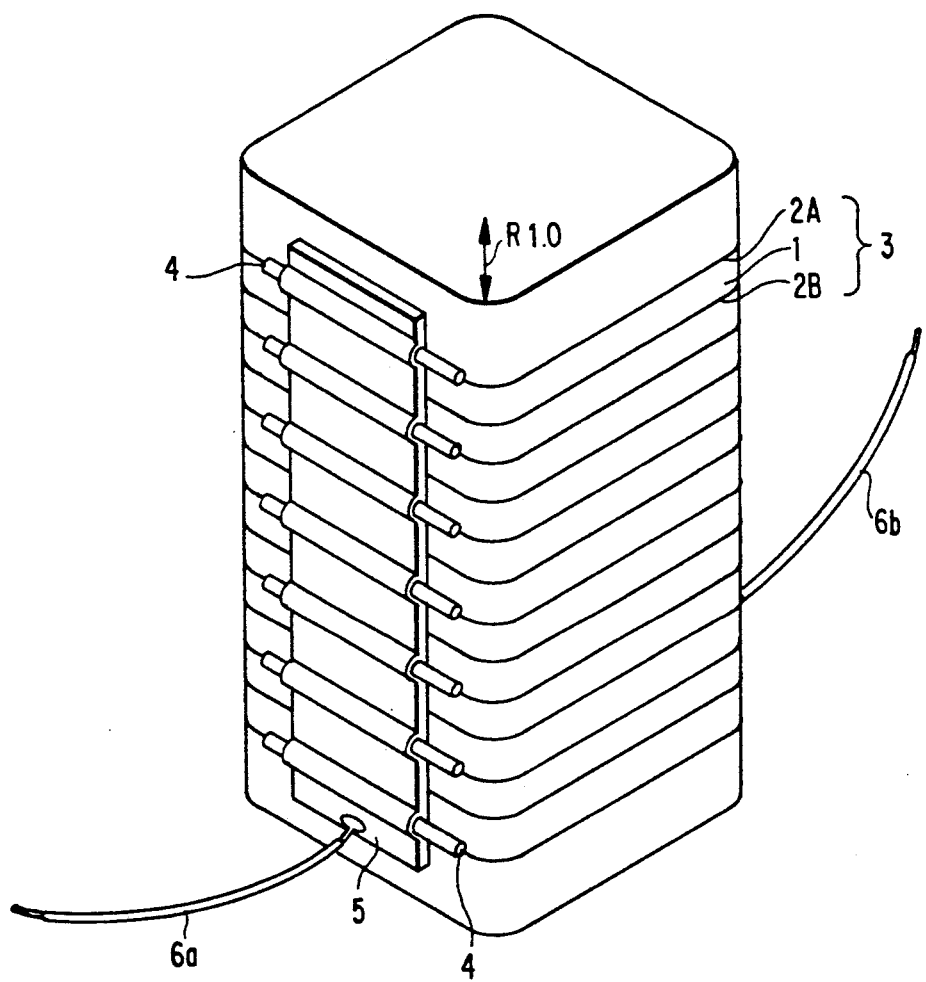
FIG. 2 is a perspective view of a first embodiment of the invention.
Figure 3:
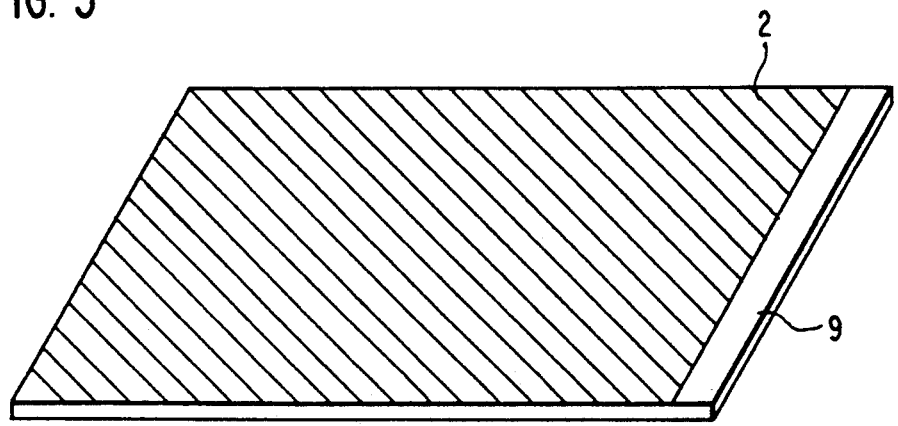
FIG. 3 is a perspective view of a ceramic body before sintering (a green sheet) with an internal electrode printed on its surface.

Next, referring to FIG. 2, in the first embodiment of the laminated type piezoelectric ceramic actuator according to the invention shown in the figure has the edges portions shown by the broken lines 8 in FIG. 1 are rounded off by removing the portions through polishing. Referring to FIG. 3, first, an internal electrode film or layer 2 is formed by screen printing, and drying, a paste of a silver-palladium alloy consisting of 70% silver and 30% palladium on one surface of a green sheet with 100 mm length, 70 mm width, and 135 μm thickness formed from a slurry having calcined powder of perovskite structure composite oxide of $Pb(Ni_{\frac{1}{3}}Nb_{\frac{2}{3}})O_3$-$PbTiO_3$-$PbZrO_3$ system by a slip casting method that uses a doctor blade.

Figure 4:
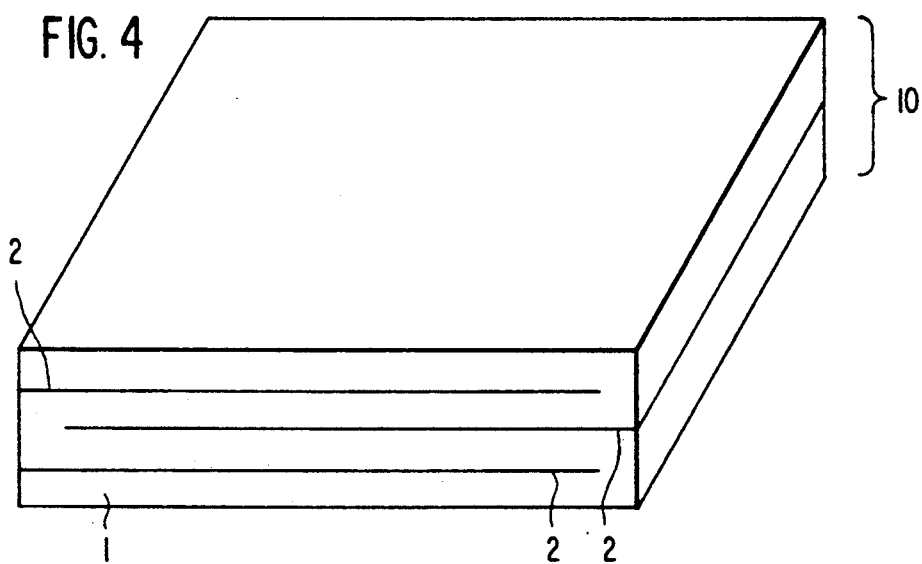
FIG. 4 is a perspective view of a sintered body obtained by sintering the lamination of the green sheet shown in FIG. 3.

Next, a green sheet 9 with an internal electrode film 2 formed on it is stacked up to 126 layers by alternating its sense in the longitudinal direction, and the stack of sheet is compression molded by applying a pressure of 100 kg/cm² both from above and from below (for simplicity only four layers are indicated in FIG. 4). After decomposing the organic binder and the plasticizer contained in the green sheets by heating the compact to 500° C. to remove them, a sintered body 10 is formed by baking the compact at 1120° C. (FIG. 4).

Figure 5:
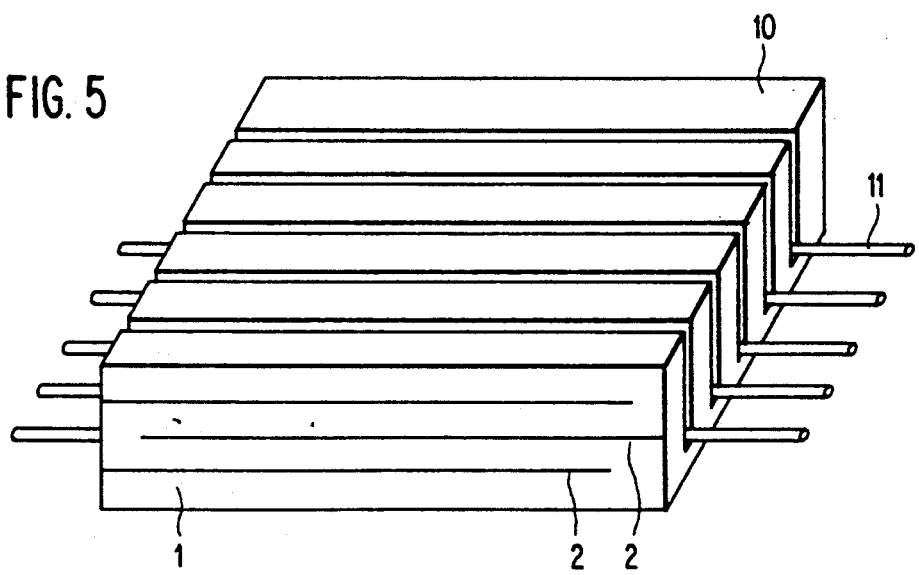
FIG. 5 is a perspective view showing the process of cutting the sintered body shown in FIG. 4 with a wire saw into a plurality of piezoelectric ceramic laminates.

Next, the sintered body 10 is cut into slender laminated bodies 12 of 5 mm width by a wire saw (detailed illustration omitted) that uses a piano wire 11 with a diameter of 0.2 mm (FIG. 5). This process is carried out by using alumina powder of No. 1200 as the abrasive powders, and moving the piano wire 11 under a force of 100 g back and forth at the speed of 1 m/sec.

Figure 6:
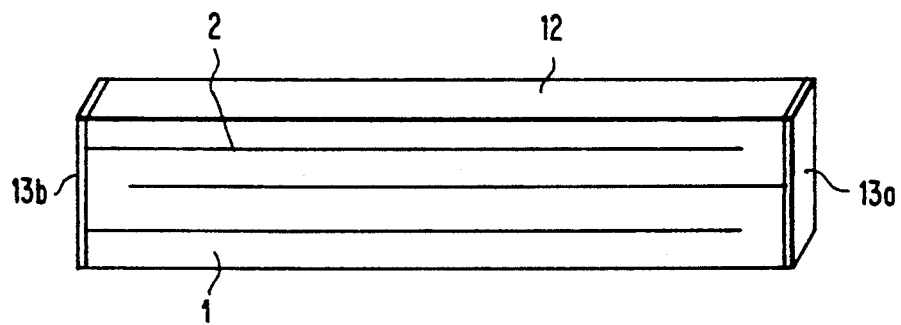
FIG. 6 is a perspective view of the laminate with a temporary electrode attached for forming a glass film by electrophoresis.

Next, a silver paste is applied to side faces forming the pair of side faces of the slender laminated body 12, where the edge of the internal electrode film 2 appears at every other layer, to form a pair of temporary electrodes 13b and 13a (FIG. 6).

Figure 7:
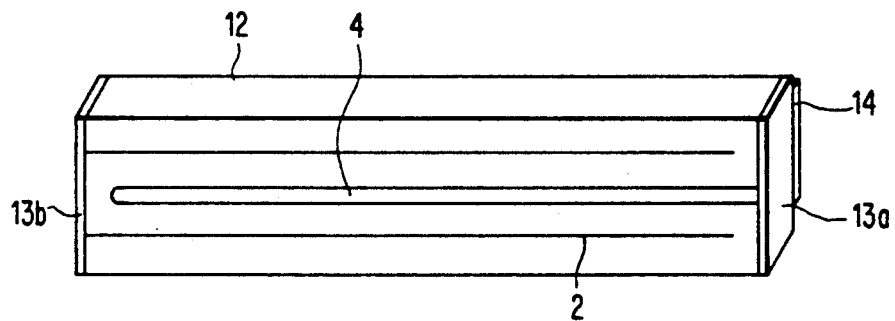
FIG. 7 is a perspective view of the laminate in which the portions of the internal electrode films exposed on the side faces of the laminate are respectively covered with a glass film.

Next, referring to FIG. 7, a masking material 14 consisting of a tape made of teflon is attached to one of the cut faces (the surface on the rear side of the perspective view in FIG. 7) of the laminated body 12, a dc voltage is applied to the electrode 13a of the slender laminated body 12, powder of zinc based crystal glass (consisting of 60% of ZnO, 25% of $B_2O_3$, and 15% of other oxides) is put on every other edge face of the internal electrode film 2 that is exposed on the other cut face (the surface on the front side of the perspective view in FIG. 7) of the laminated body 12 by electrophoresis, and slender glass films 4 are formed by baking at a temperature in the range of 600° to 800° C.

Next, a masking material is attached to the side face where the glass films 4 are formed (the surface on the front side of the perspective view in FIG. 7) by the previous process, a dc voltage is applied to the electrode 13b, and glass films are formed on the other side face of the laminated body over edge faces that are shifted every one layer from those formed by the previous process.

Figure 8:
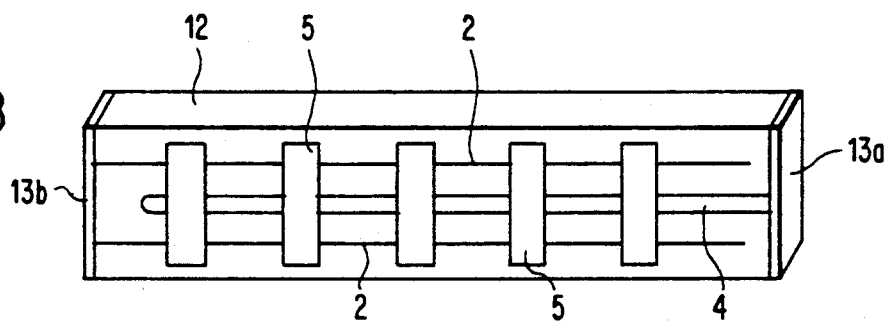
FIG. 8 is a perspective view of the laminate showing a state in which the laminate in FIG. 7 is provided with external electrodes.

Silver paste is screen printed with 5 mm spacing on both side faces where the glass films 4 are formed in the foregoing processes (FIG. 8), baked at 700° C. to form external electrodes 5, providing connection terminals between each of the internal electrode films 2 and the power unit (not shown).

Figure 9:
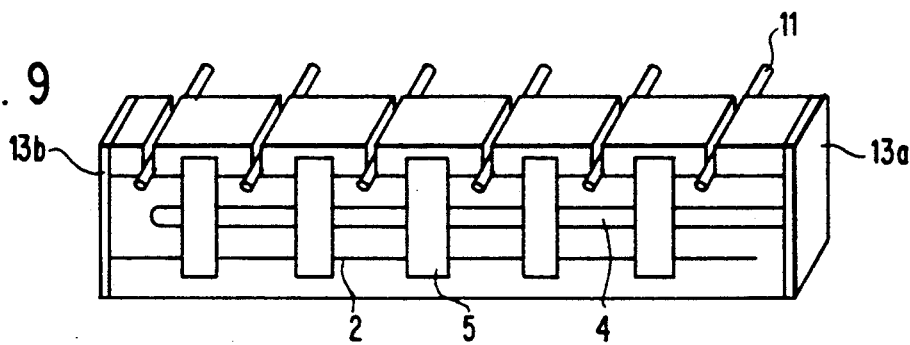
FIG. 9 is a perspective view showing the process of cutting the laminate in FIG. 8 into a plurality of laminated type piezoelectric actuators.

Further, the slender laminated body 12 that has gone through the above-mentioned processes is subjected to a cutting process using a wire saw similar to the process illustrated in FIG. 5 to be segmented into laminated bodies having a cross section of 5 mm×5 mm (FIG. 9).

Next, the laminated body obtained by the cutting process is subjected to a polishing process by a rotary polishing machine to remove the four edge parts. This polishing process is carried out by pressing the laminated body under a force of 50 to 100 g against a lapping machine having an 8-inch diameter with No. 1500 emery paper and which is rotated at 100 rpm. The pressurized contact is carried out while maintaining the state in which the direction of the edge of the laminated body is coincident with the radial direction of the lapping machine. After completion of the polishing process the laminated body is finished up by subjecting it to a buff polishing that uses alumina powder having an average grain size of 1 μm.

In the actuator according to this embodiment, the thickness of the piezoelectric ceramic piece 1 was 105 μm, there were 126 layers of the internal electrode film 2, and the cross section perpendicular to the direction of lamination, was 5 mm×5mm square with a length of 20 mm. The rounding of the edge of the laminated body, i.e., the radius of the curvature of the ridge, was selected as of 0.5 mm (represented as $R_{0.5}$), 1.0 mm ($R_{1.0}$), and 1.5 mm ($R_{1.5}$). Performance of the products was compared by applying a dc voltage of 150 V to each of the products that are provided with three kinds of curvature and a product with absolutely no curvature (the laminated body formed immediately after the cutting process shown in FIG. 9), under an environment having a temperature of 40° C. and relative humidity (RH) of 90 to 95%. The results are shown in TABLE 1.

TABLE 1

|  | Structure of Prior Art | First Embodiment of the Invention | | |
| --- | --- | --- | --- | --- |
|  | FIG. 1 | $R_{0.5}$ | $R_{1.0}$ | $R_{1.5}$ |
| Relative MTTF | 1.0 | 1.2 | 9.3 | 9.8 |

TABLE 1 shows the relation between the three sizes of curvature given to the edges of the laminated body and the mean time to failure (MTTF), where the column entries show the structure of the actuator (presence or absence of rounding for the edges of the laminated body and the magnitude of curvature) and the row entry shows the relative MTTF of the actuator of each structure. The relative MTTF in the table is determined by plotting the fracture life for each product obtained by the life test on a Weibull chart, and obtaining the MTTF for each curvature, normalized with the MTTF for the prior art actuator determined in a similar manner as 1.0.

As shown in TABLE 1, a marked improvement effect can be obtained by simply giving a curvature of about 1.0 to the edges and it can be seen that the MTTF can be increased to about 10 times that of the structure by prior art, if the curvature is increased to 1.0 or 1.5.

The cross-section perpendicular to the lamination direction of the actuator, according to the first embodiment, was observed by a color contrast penetration method and transmission type electron microscope to examine the generation conditions of the microcracks in the cut surface and the polished surface. As a result, it was found that the microcracks grow in tree-form toward the interior of the piezoelectric ceramic piece from the cut surface and the polished surface, and that the trunk of the tree is approximately perpendicular to the cut surface and the polished surface. Furthermore, it was found that the length of the microcracks is about 30 μm on the average and a maximum of about 200 μm in the case of microcracks due to cutting, while the length is about 10 μm on the average and a maximum of about 15 μm in the case of microcracks due to polishing, and that the microcracks due to polishing are shorter in length and are less irregular in length than the microcracks due to cutting.

Figure 10:
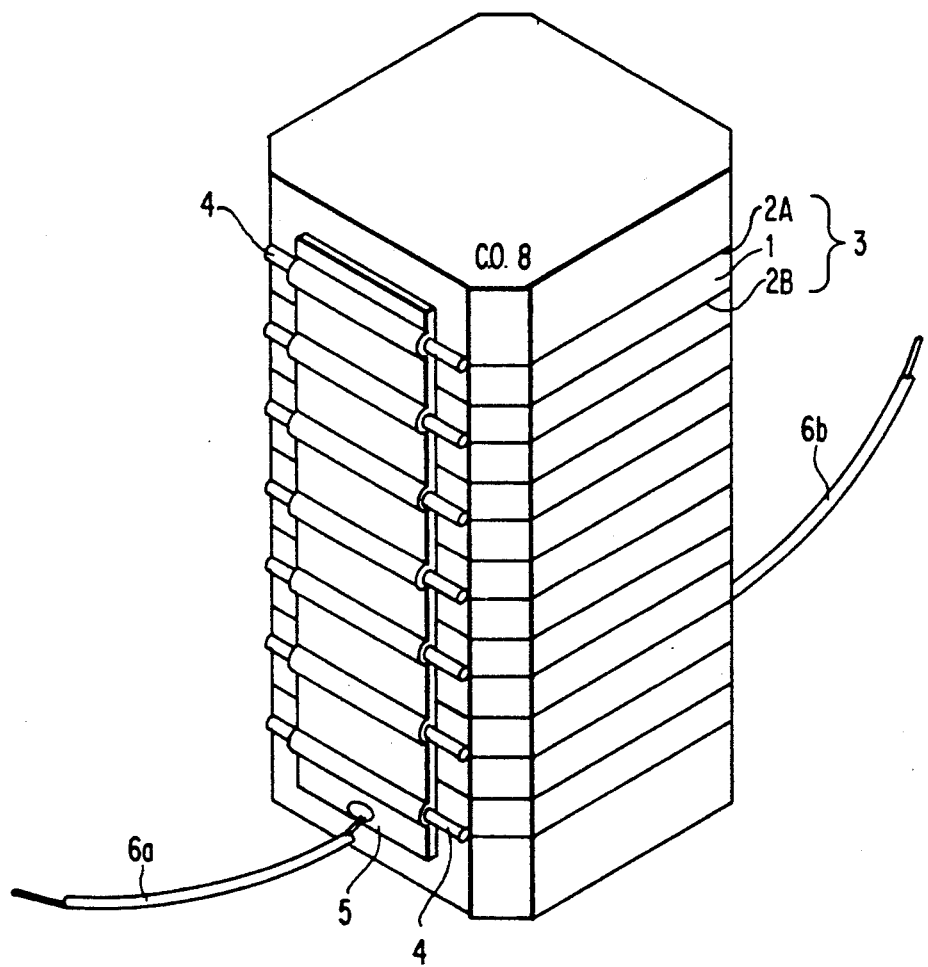
FIG. 10 is a perspective view of a second embodiment of the invention.

In the first embodiment described above, the edges are polished so as to provide a convex arcuate form in cross section, but the polished parts may be cut along an angled plane, as in the second embodiment shown in FIG. 10.

In the second embodiment of the invention, a laminated body with the same lamination structure and size as the first embodiment was manufactured, and the laminated body was formed into an actuator by finishing the four edge parts into angled, planar form by the same polishing process as in the first embodiment. The angled, planar surface was chambered to a length of 0.4 mm (represented as $C_{0.4}$), 0.8 mm ($C_{0.8}$), and 1.2 mm ($C_{1.2}$). The result of comparison of performance, by carrying out a humidity resistance on-load life test under the same conditions as in the first embodiment for the three lengths and a prior art product which was not subjected to the polishing process, is shown in TABLE 2.

TABLE 2

|  | Structure of Prior Art | First Embodiment of the Invention | | |
| --- | --- | --- | --- | --- |
|  | FIG. 1 | $C_{0.4}$ | $C_{0.8}$ | $C_{1.2}$ |
| Relative MTTF | 1.0 | 1.1 | 9.0 | 9.9 |

Analogous to TABLE 1, in TABLE 2 the column entry shows the structure of the laminated body and the row entry shows the relative MTTF of the actuator of each structure.

Referring to TABLE 2, the MTTF of the actuator is increased as the chamfering length of the laminated body is increased, as in the case of arcuate polishing of the edge parts. In particular, it can be seen that the improvement effect is marked when the chamfering length is equal to or greater than 0.8, with the MTTF reaching about 10 times that of the prior art. In the above, described second embodiment the machining process by polishing is easier in comparison to the first embodiment and hence is adapted for mass production.

In the two embodiments described above, use has been made of an actuator with a cross section of the laminated body in the direction perpendicular to the direction of lamination which is square with an area of 5 mm×5 mm. However, even when the cross section is larger than this or is rectangular rather than square, it is possible to increase the life of the actuator to about 10 times the life of the actuator of the prior art by polishing each of the four edges of the cross section of the laminated body to an arcuate shape with radius of curvature of at least 1.0 mm or an angled, planar shape (that is, the shape obtained by the chamfering) by chamfering the edges to a length of at least 0.8 mm.

The embodiments described above are based on a piezoelectric ceramic piece with specific material, but it is possible to achieve the same effect by appropriately varying the extent of the machining of the edges when other material is used instead.

As has been described above, the edge parts of the laminated type piezoelectric actuator according to the invention are removed so that the microcracks that are also distributed in the edge parts are removed, and the actuator tends to be less affected by the operating environment.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the inventions.

What is claimed is:

1. A laminated type piezoelectric actuator comprising:

a laminated body of piezoelectric ceramic layers and internal electrode layers, each of said layers having substantially the same cross sectional area;

insulator films respectively covering exposed portions of odd numbered and even numbered layers of said internal electrode layers at one and the other of a mutually opposing pair of side faces running in parallel with the lamination direction of said laminated body; and external electrode films provided on the respective side faces covering said insulator films and the exposed portions of said internal electrode layers for electrical connection therebetween, wherein said laminated body has edges extending in parallel to the lamination direction, and said edges are machined to form one of a convex, arcuate shape or an angled, planar shape, thereby reducing the formation of microcracks at said edges.

2. A laminated type piezoelectric actuator as claimed in claim 1, wherein said piezoelectric ceramic layers comprise a $Pb(Ni_{1⁄66} Nb_{1⁄3})O_3$—$PbTiO_3$—$PbZrO_3$ system perovskite structure compound oxide.

3. A laminated type piezoelectric actuator as claimed in claim 1, wherein the convex, arcuate ridges exhibit a radius of curvature equal to or greater than 1.0 mm.

4. A laminated type piezoelectric actuator, as recited in claim 1, wherein the angled, planar ridges exhibit a length equal to or greater than 0.8 mm.

* * * * *

UNITED STATES PATENT AND TRADEMARK OFFICE
CERTIFICATE OF CORRECTION

PATENT NO. : 5,252,883
DATED : October 12, 1993
INVENTOR(S) : Masahiro KONDO

It is certified that error appears in the above-indentified patent and that said Letters Patent is hereby corrected as shown below:

Col. 5, lines 54-55, delete "effect".

Col. 6, line 21, delete "chambered", and insert --chamfered--.

Col. 8, line 15, delete "$Ni_{166}$", and insert --$Ni_{16}$--;

Col. 8, line 18, delete "ridges", and insert --edges--;

Col. 8, line 21, delete "ridges", and insert --edges--.

Signed and Sealed this

Twenty-third Day of August, 1994

Attest:

BRUCE LEHMAN

*Attesting Officer*     *Commissioner of Patents and Trademarks*